United States Patent
Loh et al.

(10) Patent No.: US 7,280,288 B2
(45) Date of Patent: Oct. 9, 2007

(54) COMPOSITE OPTICAL LENS WITH AN INTEGRATED REFLECTOR

(75) Inventors: Ban P. Loh, Durham, NC (US); Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/861,639

(22) Filed: Jun. 4, 2004

(65) Prior Publication Data

US 2005/0270666 A1    Dec. 8, 2005

(51) Int. Cl.
*G02B 17/00* (2006.01)
*F21V 5/04* (2006.01)

(52) U.S. Cl. ..................... 359/726; 362/335

(58) Field of Classification Search ........ 359/726–727, 359/707; 362/335, 555; 438/29, 65, 111
See application file for complete search history.

(56) References Cited

U.S. PATENT DOCUMENTS

| | | | |
|---|---|---|---|
| 4,267,559 A | 5/1981 | Johnson et al. |
| 5,173,839 A | 12/1992 | Metz, Jr. |
| 5,785,418 A | 7/1998 | Hochstein |
| 5,789,772 A | 8/1998 | Jiang |
| 5,841,177 A | 11/1998 | Komoto et al. |
| 5,869,883 A | 2/1999 | Mehringer et al. |
| 5,959,316 A | 9/1999 | Lowery |
| 5,998,925 A | 12/1999 | Shimizu et al. |
| 6,238,599 B1 | 5/2001 | Gelorme et al. |
| 6,274,924 B1 | 8/2001 | Carey et al. |
| 6,307,272 B1 | 10/2001 | Takahasi et al. |
| 6,323,063 B2 * | 11/2001 | Krames et al. ............... 438/29 |
| 6,329,706 B1 | 12/2001 | Nam |
| 6,335,548 B1 | 1/2002 | Roberts et al. |
| RE37,707 E | 5/2002 | Bozzini et al. |
| 6,429,513 B1 | 8/2002 | Shermer, IV et al. |
| 6,444,498 B1 | 9/2002 | Huang et al. |

(Continued)

FOREIGN PATENT DOCUMENTS

DE    EP1055867    * 11/2000

(Continued)

OTHER PUBLICATIONS

U.S. Patent Application Entitled: Power light emitting die package with reflecting lens and the method of making the same U.S. Appl. No. 10/861,929 Inventor(s): Ban P. Loh, Gerald H. Negley Filing date: Jun. 4, 2004 Published date: Not yet published.

(Continued)

*Primary Examiner*—Alicia M Harrington
(74) *Attorney, Agent, or Firm*—Jenkins, Wilson, Taylor & Hunt, P.A.

(57) ABSTRACT

A composite optical lens is disclosed. The composite optical lens includes a concave bottom surface adapted to receive light, reflective surface adapted to reflect the received light, and optical surface through which the reflected light leaves the optical lens. The concave bottom surface defines a concave cavity allowing placement of at least a portion of a light emitting device within the concave cavity. The concave bottom surface, the optical surface, or both may have predetermined optical finish to operate on the light such as diffusing or focusing the light. The reflective surface can be coated, designed, or both for total internal reflection effect.

11 Claims, 5 Drawing Sheets

U.S. PATENT DOCUMENTS

| | | |
|---|---|---|
| 6,456,766 B1 | 9/2002 | Shaw et al. |
| 6,457,645 B1 | 10/2002 | Gardner, Jr. |
| 6,468,821 B2 | 10/2002 | Maeda et al. |
| D465,207 S | 11/2002 | Williams et al. |
| 6,492,725 B1 | 12/2002 | Loh et al. |
| 6,541,800 B2 | 4/2003 | Barnett et al. |
| 6,559,525 B2 | 5/2003 | Huang |
| 6,680,491 B2 | 1/2004 | Nakanishi et al. |
| 6,707,069 B2 | 3/2004 | Song et al. |
| 6,746,295 B2 * | 6/2004 | Sorg ............ 438/27 |
| 6,770,498 B2 * | 8/2004 | Hsu ............ 438/29 |
| 6,811,277 B2 * | 11/2004 | Amano ............ 362/602 |
| 6,897,486 B2 | 5/2005 | Loh |
| 7,073,931 B2 * | 7/2006 | Ishida ............ 362/539 |
| 2002/0113244 A1 | 8/2002 | Barnett et al. |
| 2003/0057573 A1 | 3/2003 | Sekine et al. |
| 2003/0168720 A1 | 9/2003 | Kamada |
| 2003/0193080 A1 | 10/2003 | Cabahug et al. |
| 2004/0126913 A1 | 11/2003 | Loh |
| 2004/0041222 A1 | 3/2004 | Loh |
| 2004/0079957 A1 | 4/2004 | Andrews et al. |
| 2004/0173804 A1 | 9/2004 | Yu |
| 2004/0223315 A1 * | 11/2004 | Suehiro et al. ............ 362/84 |
| 2004/0264201 A1 * | 12/2004 | Wisler ............ 362/343 |
| 2005/0003565 A1 * | 1/2005 | Eisert et al. ............ 438/29 |
| 2005/0135109 A1 * | 6/2005 | Stout ............ 362/509 |
| 2005/0135113 A1 * | 6/2005 | Wang et al. ............ 362/561 |

FOREIGN PATENT DOCUMENTS

| | | | |
|---|---|---|---|
| JP | 2002103977 | | 10/2003 |
| WO | WO 03/026031 | * | 3/2003 |

OTHER PUBLICATIONS

U.S. Provisional application entitled, "LED Package with a Long Stem Body as Heat-Spreader and a Small Footprint." U.S. Appl. No. 60/431,501. Filed Dec. 6, 2002.

U.S. Provisional application entitled, "Leadframe Based LED or Semiconductor Package with Improved Heat Spreading." U.S. Appl. No. 60/431,523. Filed Dec. 6, 2002.

* cited by examiner

COMPOSITE OPTICAL LENS WITH AN INTEGRATED REFLECTOR

BACKGROUND

The present invention relates to the field of packaging semiconductor devices, and more particularly to packaging light emitting diodes.

Light emitting devices (LEDS) such as light emitting diodes are often packaged within leadframe packages. A leadframe package typically includes an LED connected to thin metal leads where the LED and most of the leads are completely encapsulated within a plastic body. A part of the plastic body defines a lens. A portion of the leads connected to the LED extends outside the plastic body. The metal leads of the leadframe package serve as the conduit to supply the LED with electrical power and, at the same time, may act to draw heat away from the LED. Heat is generated by the LED when power is applied to the LED to produce light. The portion of the leads that extend out from the package body connects to circuits external to the leadframe package.

Some of the heat generated by the LED is dissipated by the plastic package body; however, most of the heat is drawn away from the LED via the metal components of the package. The metal leads are typically very thin and have small cross sections. For this reason, capacity of the metal leads to remove heat from the LED is limited. This limits the amount of power that can be sent to the LED. This, in turn, limits the amount of light that can be generated by the LED.

To increase the capacity of an LED package to dissipate heat, in one LED package design, a heat sink slug is introduced into the package. The heat sink slug draws heat from the LED chip, thus increasing the heat dissipating capacity of the LED package. However, this design introduces free space in the optical cavity of the package that needs to be filled with a refractive-index-matching clear encapsulant within the package to extract light from the LED chip. Unfortunately, the volumetric expansion and contraction of the encapsulant typically exceeds that of the space that contains it. Hence, as the temperature rises, the encapsulant expands and overflows or is oozed out from the cavity through vent holes. Further, when it cools, the encapsulant contracts, creating a partial vacuum inside the cavity, and thus causing air or moisture to be sucked in. Sometimes, voids are formed inside the encapsulant or it delaminates from various components that it comes into contact with. This adversely affects the light output and reliability of the package. Furthermore, this design commonly includes a pair of flimsy leads which are typically soldered by a hot-iron. This ironing process is incompatible with the commonly used SMT (Surface Mount Technology) electronic board assembly processes.

In another LED package design, leads of the leadframe are made of different thicknesses in various shapes and configurations and extend beyond the immediate edge of the LED package body. The package body is molded with transparent thermoset plastic which usually serves as the encapsulation material for the package. These leads are typically thicker than the leads of the LEDS of the previous design. The thicker lead is utilized as a heat-spreader and the LED chip is mounted on it. This arrangement allows heat generated by the LED chip to dissipate through the thicker leads which are connected thermally to an external heat sink. Unfortunately, this design is inherently unreliable due to large difference in coefficient of thermal expansion (CTE) between the plastic body, the encapsulant and the leadframe materials. Thus, when subjected to temperature cycles of, say, −40 C to 120 C, most or all components of the LED package experience high thermal stresses, especially at contact points. This frequently results in cracking of the LED chips, delamination of plastic body from the leads, breaking of bond wires, or a combination of these problems. In addition, the extended leads increase the size of the LED package size and footprint. The increased size prevents mounting of the packages in a dense cluster on a PCB (printed circuit board) to generate bright light for certain applications, for example, for automobile lighting or for general illumination.

Another disadvantage of the current high power leadframe package designs is that the thick lead material cannot be stamped into a fine circuit for flip-chip or mounting of several LED chips that can be addressed independently for color control.

Consequently, there remains a need for an improved LED package that overcomes or alleviates one or more of the shortcomings of the prior art packages.

SUMMARY

The need is met by the present invention. In one embodiment of the present invention, a composite optical lens includes a concave bottom surface adapted to receive light, reflective surface adapted to reflect the received light, and optical surface through which the reflected light leaves the optical lens. The concave bottom surface defines a concave cavity allowing placement of at least a portion of a light emitting device within the concave cavity. The concave bottom surface, the optical surface, or both may have predetermined optical finish to operate on the light such as diffusing or focusing the light. The reflective surface can be coated, designed, or both for total internal reflection effect.

Other aspects and advantages of the present invention will become apparent from the following detailed description, taken in conjunction with the accompanying drawings, illustrating by way of example the principles of the invention.

DETAILED DESCRIPTION

The present invention will now be described with reference to the FIGS. 1A through 4, which illustrate various embodiments of the present invention. In the Figures, some sizes of structures or portions are exaggerated relative to sizes of other structures or portions for illustrative purposes and, thus, are provided to illustrate the general structures of the present invention. Furthermore, various aspects of the present invention are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion.

Furthermore, relative terms such as "on" or "above" are used herein to describe one structure's or portion's relationship to another structure or portion as illustrated in the Figures. It will be understood that relative terms such as "on" or "above" are intended to encompass different orientations of the device in addition to the orientation depicted in the Figures. For example, if the device in the Figures is turned over, structure or portion described as "above" other structures or portions would now be oriented "below" the other structures or portions. Likewise, if the device in the Figures is rotated along an axis, structure or portion described as "above" other structures or portions would now be oriented "next to" or "left of" the other structures or portions. Like numbers refer to like elements throughout.

As shown in the figures for the purposes of illustration, embodiments of the present invention are exemplified by a light emitting die package including a leadframe and molded body integrated with portions of the leadframe. At least one light emitting device (LED) such as a light emitting diode is mounted on the leadframe. The molded body has an opening that surrounds the LED and has latches for latching a heatsink. The LED is covered by an encapsulant that substantially fills the opening.

The molded body is made of high temperature plastic providing structural support to relatively thin leadframe. The LED is mounted on a main lead of the leadframe and is connected by bond wires to other leads for additional electrical connections.

A lens coupled to the molded body above the opening to provide optical functions for light generated by the LED. As discussed in more detail below, the lens occupies much of the opening around the LED thus reducing the amount of encapsulant used within the package. This alleviates the differential thermo stress problems associated with the volumetric expansion and contraction of the encapsulant discussed above, leading to lower failure rates and relatively higher reliability.

A heatsink is coupled to the leadframe, using the latches, to further aid in heat dissipation. The latch design allows for simpler and less costly manufacture of the die package.

Apparatus

Figure 1A:
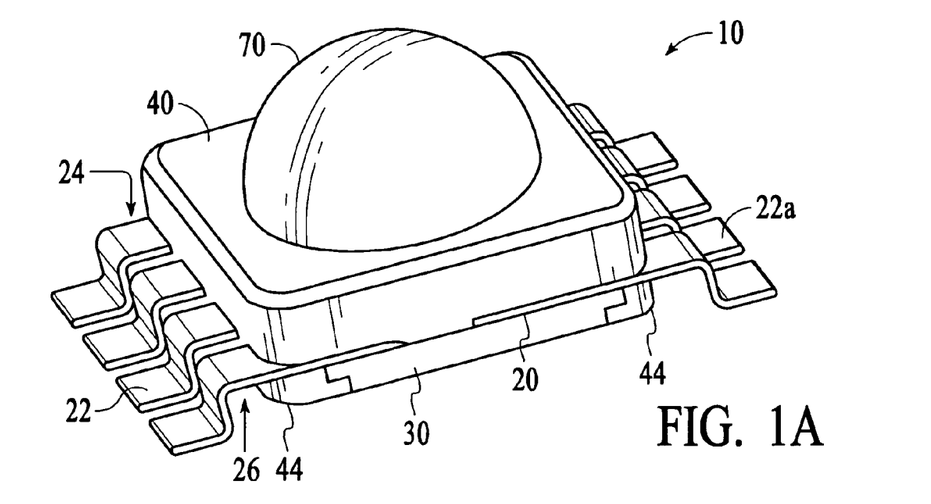
FIG. 1A is a perspective view of a light emitting die package according to one embodiment of the present invention.
Figure 1B:
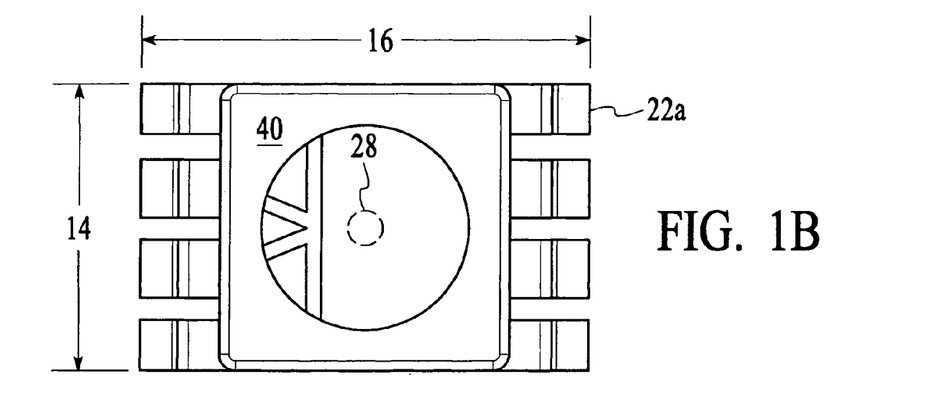
FIG. 1B is a top view of the light emitting die package of FIG. 1 but without lens illustrated in FIG. 1A.
Figure 1C:
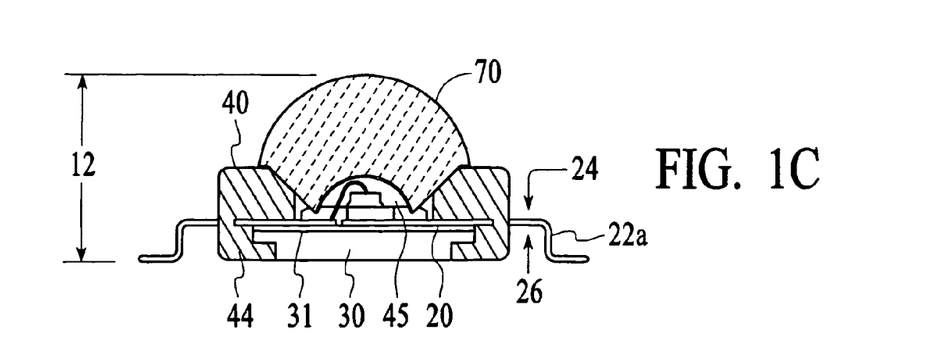
FIG. 1C is a cutaway side view of the light emitting die package of FIG. 1.
Figure 2A:
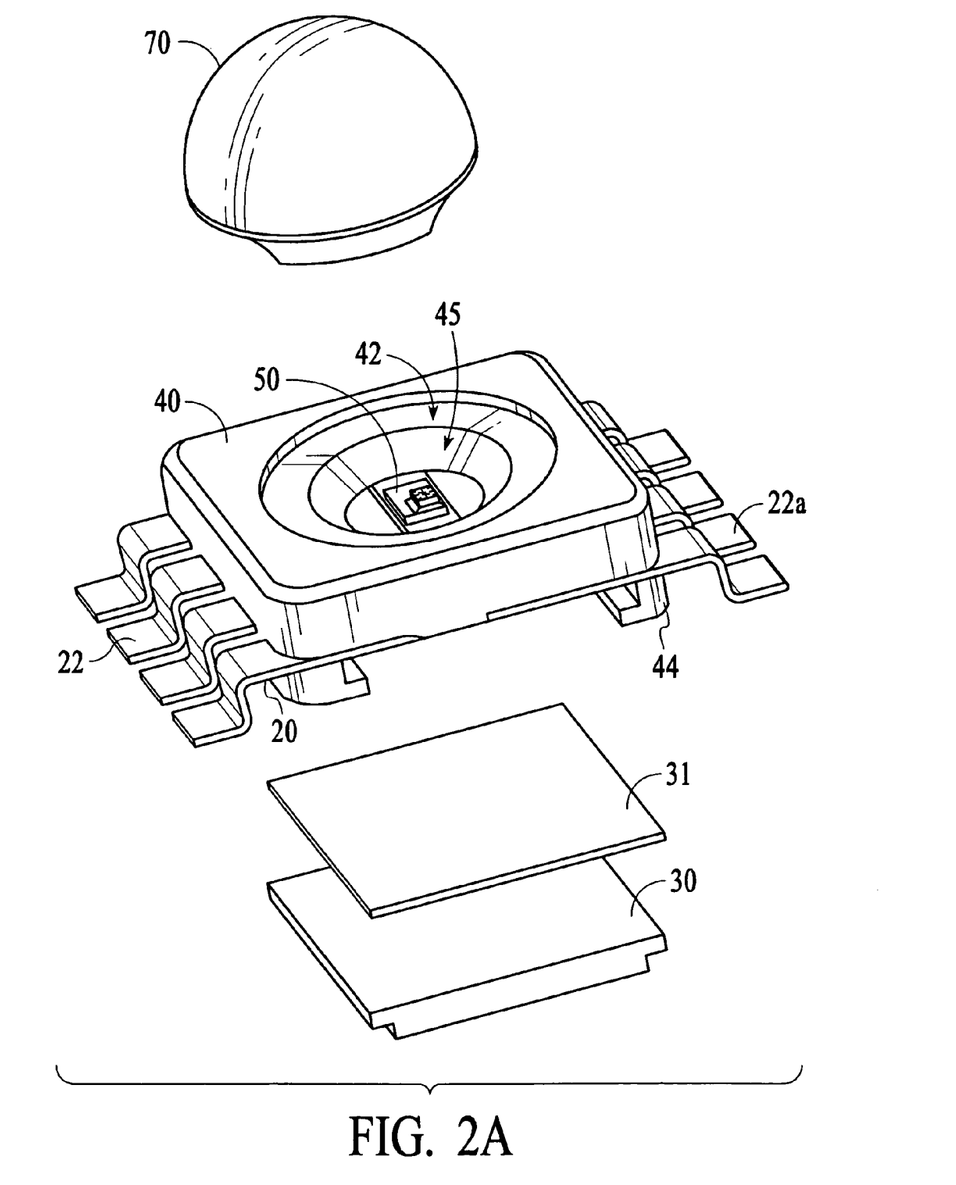
FIG. 2A is an exploded perspective view of the light emitting die package of FIG. 1.
Figure 2B:
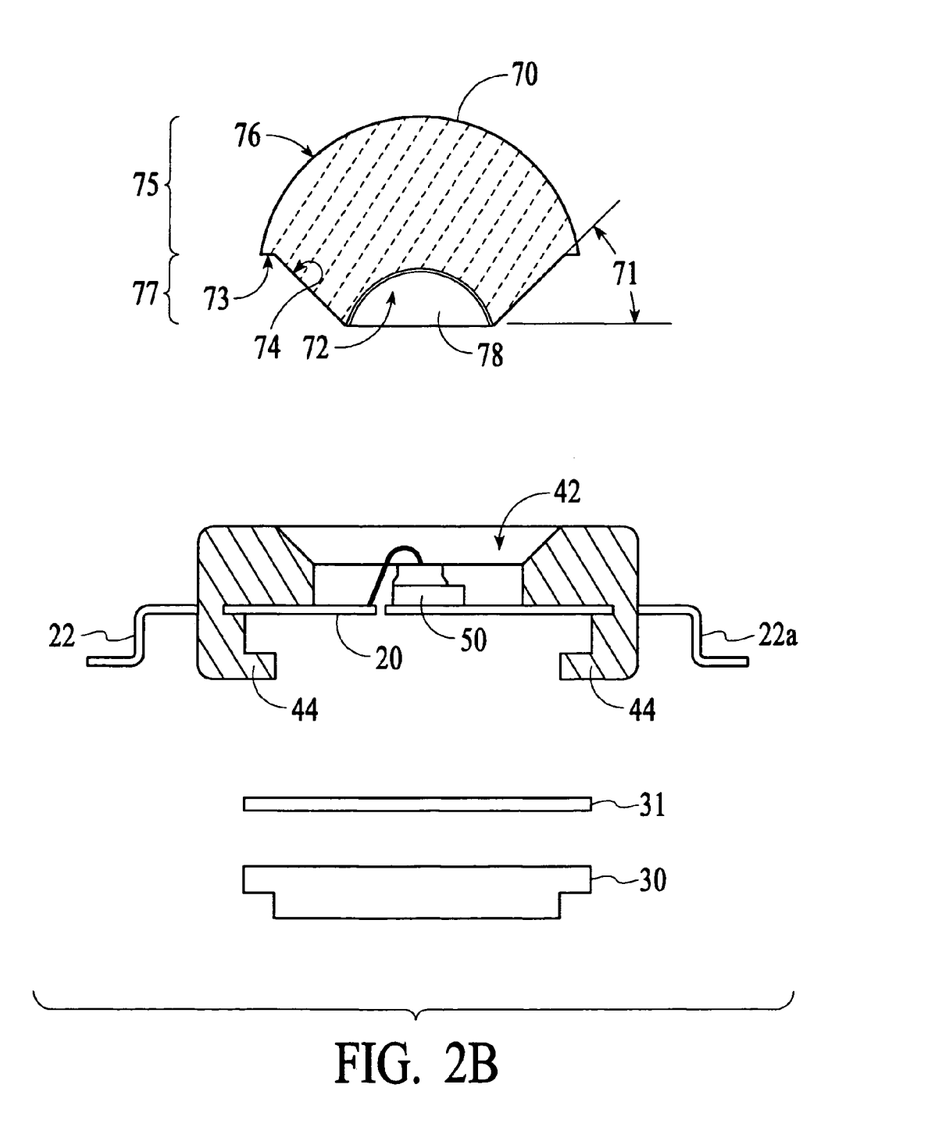
FIG. 2B is a exploded cutaway side view of the light emitting die package of FIG. 1.

FIG. 1A is a perspective view of a light emitting die package 10 according to one embodiment of the present invention. FIG. 1B is a top view of the light emitting die package 10 illustrated without lens and without light emitting devices both of which are illustrated in FIG. 1A. FIG. 1C is a cutaway side view of the light emitting die package 10. FIG. 2A is an exploded perspective view of the light emitting die package 10. FIG. 2B is an exploded cutaway side view of the light emitting die package 10.

Referring to FIGS. 1A through 2B, the light emitting die package 10 includes a leadframe 20 including a plurality of leads, collectively referred to as leads 22. In the Figures, to avoid clutter, not all the illustrated leads are designated with the reference number 22. The leadframe has a top side 24 and a bottom side 26. The leadframe 20 is made of metal or other electrically conductive material having a predetermined thickness that can vary greatly depending on the desired characteristics and application. For example, the thickness of the leadframe 20 may be in the order of tens or hundreds of microns.

A portion of the leadframe 20 such as a first lead 22a, generally in the center, defines a mounting pad 28 on which a light emitting device (LED) assembly 50 is mounted. The light emitting device (LED) assembly 50 includes at least one light emitting device (LED) such as a light emitting diode.

A molded body 40 is integrated with portions of the leadframe 20 in that an upper portion of the molded body 40 is above the leadframe 20 while a lower portion of the same molded body 40 is below the leadframe 20. In the illustrated sample embodiment, the molded body 40 covers a significant portion of the leadframe 20. The upper portion of the molded body 40 defines an opening 42 surrounding the mounting pad 28. The lower portion of the molded body 40 includes latches 44. A heatsink 30 can be attached to the leadframe 20 by engaging the latches 44.

The heatsink 30, when engaged to the leadframe 20, draws heat generated by the LED assembly 50 when energized and aids in dissipation of the generated heat. To avoid electrical shorts, the heatsink 30 is made of dielectric material. Alternatively, if the heatsink 30 is made using electrically conductive material, then the heatsink 30 can be separated from the leadframe by a dielectric layer 31. The dielectric layer 31 can be, for example, glass or organic polymer filled with highly thermally conductive ceramics.

A lens 70 is coupled to the molded body 40 at its opening 42 and over the LED assembly 50. The molded body 40 can be injection molded onto and around the leadframe 20 using high temperature plastic. Material for the molded body 40 is known in the art. The molded body 40 can be injection molded onto and around the leadframe 20 using high temperature plastics. Examples of the material for the molded body 40 are LCP (Liquid Crystal Polymers) filled with glass or carbon fibers.

The lens 70 can be rigidly attached to the molded body 40 by an adhesive or by mechanical means at its opening 42 and over the LED assembly 50. Alternatively, the lens can couple to the molded body 40 by the soft encapsulant adhesive such that the lens is allowed to float on the molded body 40 as the temperature rises or falls.

The heatsink 30 is typically made of thermally conductive materials such as, for example, copper, aluminum, or ceramics.

Size of the light emitting die package 10 can vary widely depending on its desired characteristics and application. In the illustrated embodiment, the dimensions of the light emitting die package 10 can be in the order of a few millimeters (mm) or tens of millimeters. For example, the light emitting die package 10 can have the following dimensions: thickness 12 ranging from approximately 3 mm to approximately 50 mm; length 14 ranging from approximately 5 mm to approximately 40 mm; and width 16 ranging from approximately 5 mm to approximately 30 mm.

Method

A method of manufacturing the light emitting die package 10 of FIG. 1A can be discussed using FIGS. 3A to 3D. FIGS. 3A through 3D are perspective illustrations of the light emitting die package 10 at various stages of its manufacturing process. To manufacture the light emitting die package 10 of FIG. 1A, a leadframe strip 80 is fabricated. For illustratively purposes, in FIG. 3A, the leadframe strip 80 is fabricated for manufacturing of two light emitting die packages. In fact, a leadframe strip can be fabricated to manufacture multiple light emitting die packages simultaneously.

Referring to FIGS. 3A through 3D, the leadframe strip 80 includes a plurality of leads 22 and a crossbar 82 surrounding and supporting the leads 22. The leadframe strip 80 and the leads 22 have a top side 24 (that is the same side as the top side 24 of leadframe 20 of FIGS. 1A to 2B) and a bottom side 26 (that is the same side as the bottom side 26 of leadframe 20 of FIGS. 1A to 2B). As also illustrated in FIG. 1B, a portion of a first lead 22a defines the mounting pad 28. The leadframe strip 80 is fabricated by stamping a sheet of electrically conductive material such as metal. The thickness of the material may vary greatly depending on the desired application, for example, the thickness may range in tens or hundreds of microns. Alternately, the leadframe strip 80 can be fabricated using a chemical etching or milling processes.

The molded body 40 is molded and integrated with portions of the leadframe strip 80 and the heatsink 30. The molded body 40 defines the opening 42 surrounding the mounting pad 28. Further, the molded body 40 includes the latches 44 on the bottom side 26 of the leadframe 20.

Before molding the body 40 is integrated with the leadframe strip 80, the heatsink 30 can be attached to the leadframe strip 80 with a dielectric adhesive film as discussed above and as illustrated in FIG. 3B. The molded plastic body 40, when molded onto the leadframe strip 80, locks the heatsink 30 using the latches 44 as illustrated, for example, in FIG. 1A.

Then, as also illustrated in FIGS. 2A and 2B, the LED assembly 50 including at least one light emitting device is mounted on the mounting pad 28. Next, the LED assembly 50 is encapsulated by an encapsulant such as soft silicone or any visco-elastic polymer of low durometer or hardness. The lens 70 is then coupled to the molded body 40 over the opening 42 thereby defining an enclosed optical cavity 45 illustrated, for example, in FIGS. 1C and 2B.

The optical cavity 45 of FIGS. 1C and 2B, is substantially filled with the encapsulant. Depending on the desired results, the cavity 45 can be completely filled or partially filled while leaving an expansion space or free space behind or under the reflector of the lens, the expansion space being free of the encapsulant. Then, the crossbar 82 portion of the leadframe strip 80 is separated leaving the leadframe frame die package 10 with external portions of leads 22 sticking out of the molded body 40. Finally, the external portions of the leads 22 are bent to a gull-wing shape as illustrated, for example, in FIGS. 1A and 1C.

Lens

Figure 3A:
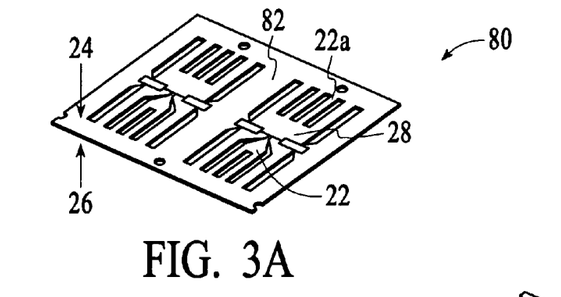
FIGS. 3A through 3D are perspective illustrations of a light emitting die package at various stages of its manufacturing process.
Figure 3B:
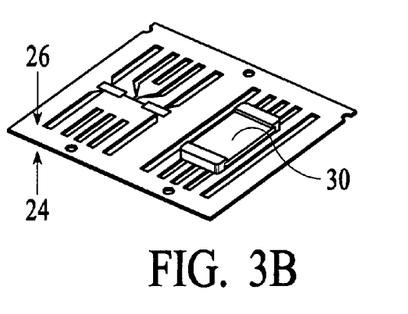
Figure 3C:
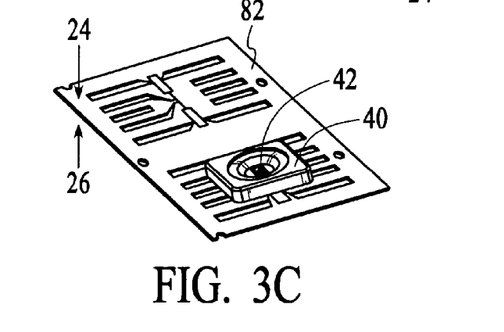
Figure 3D:
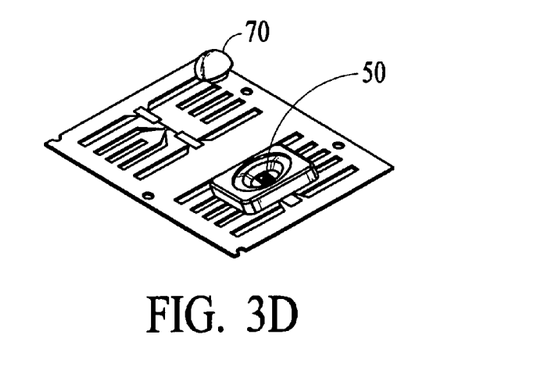
Figure 4:
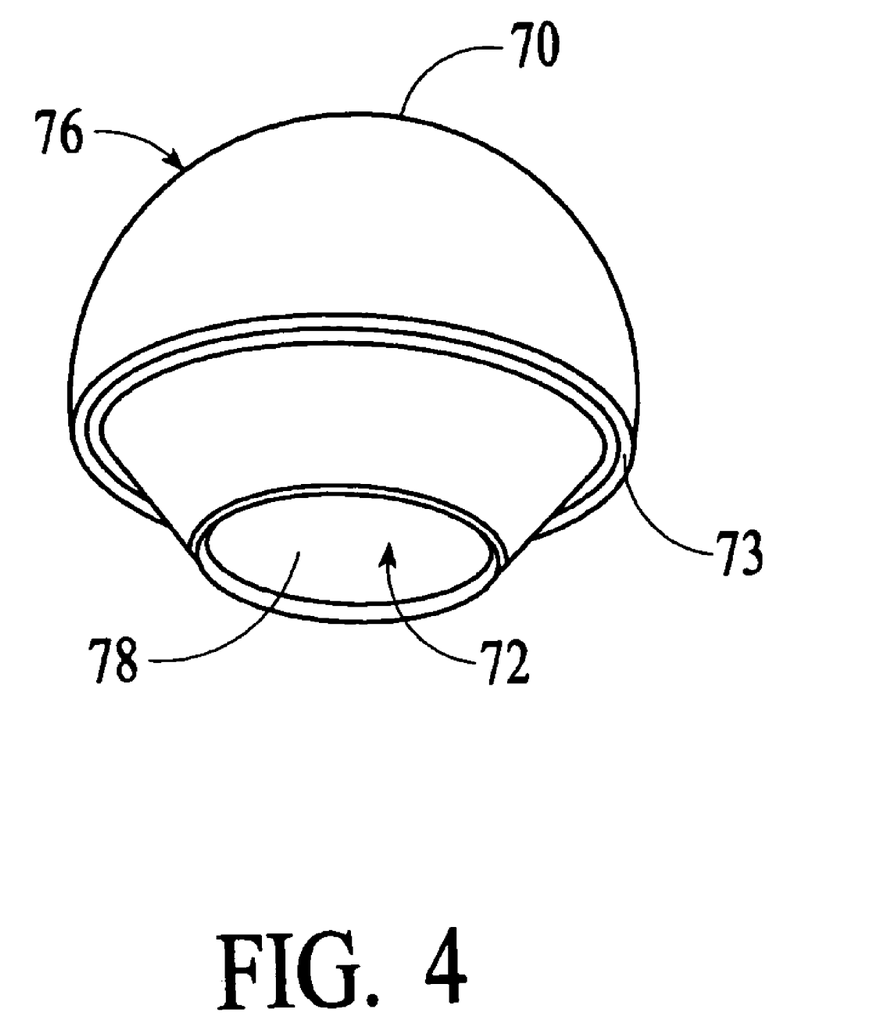
FIG. 4 is a perspective view of a lens according to one embodiment of the present invention.

The lens 70 is illustrated in FIGS. 1A, 1C, 2A, 2B, 3D, and 4. In particular, FIGS. 2A, 3D, and 4 illustrate perspective views of the lens 70 and FIGS. 1C and 2B illustrate cutaway side view of the lens 70. Referring to these illustrations of the lens 70 but more particularly to FIGS. 2B and 4, in the illustrated embodiment, the lens 70 includes two portions—an upper portion 75 and a lower portion 77. The upper portion 75 includes an optical surface 76 affecting optical performance of the die package 10.

The lower portion 77 includes a concave bottom surface 72, placed over the LED assembly 50, adapted to receive light from the LED assembly 50. Furthermore, the lower portion 77 defines concave cavity 78 in its central portion to provide space for the LED assembly 50. The concave cavity 78, in combination with the leadframe 20, forms the enclosed optical cavity 45 as discussed above.

The concave bottom surface 72 of the lens 70 can be coated with optical material intended to influence or change the nature of the light emitted by the LED chip(s) before it leaves the die package 10. Examples of types of optical materials are luminescence converting phosphors, dyes, fluorescent polymers or other materials which absorb some of the light emitted by the chip(s) and re-emit light of different wavelengths. Examples of other optical materials are light diffusants (such as Titanium oxides) or void which disperse or scatter light. Any individual or combination of these materials can be applied on the lens to obtain certain spectral and luminous performance.

Also included in the lower portion 77 is an outer reflective surface 74 coated with reflective material. The outer reflective surface 74 is adapted to collect and to reflect the received light from the LED assembly 50. The outer reflective surface 74 is coated with reflective material such as, for example, silver, gold, or Aluminum. The reflected light leaves the lens 70 through the optical surface 76. The reflective material can be applied to the outer reflective surface 74 by chemical deposition, printing and curing of metal paste using thick film technology.

The reflective surface 74 can be placed at an angle that is greater than critical angle 71 to provide a total internal reflection (TIR) for at least a portion of the light emitting by the LED assembly 50. Further, the reflective surface 74 can be fabricated to have a predetermined optical finish adopted to scatter the light in order to mix the light emitted by different color LED chips placed inside the optical cavity. For placement of the lens 70 on the rest of the light emitting die package 10, the lens 70 may include a ledge 73.

The lower portion 77 of the lens 70 occupies much (perhaps even more than 50%) of the opening 42 that surrounds the LED assembly 50. Consequently, spatial volume of the opening 42 that would have been filled by encapsulant in prior art designs is reduced. The reduction spatial volume of the opening 42 reduces the amount of the encapsulant used to fill the volume. The reduction of the encapsulant alleviates the differential thermal stress problems associated with the volumetric expansion and contraction of the encapsulant discussed above. Consequently, the package 10 of the present invention has lower failure rates and relatively higher reliability.

The lens 70 can be attached to the molded body 40 in a number of ways. For example, the lens 70 is adhered to the encapsulant such that the lens 70 sits on and floats on the encapsulant during temperature cycles. Alternatively, the lens 70 is fixed at its ledge 73 to the molded body 40. A small gap, the expansion space, of few hundreds of microns exists between lowest point of the lens 70 and the top side 24 of the leadframe 22. This gap allows the encapsulant to breathe (expand and contract) through this gap during temperature cycles such that little, if any, high thermal stresses is experienced by other portions of the die package 10. This reduces failure by delamination, cracking, and other causes related to thermal related stresses.

The optical surface 76 is a portion of outer surface of the composite optical lens 70. Light (both reflected light and non-reflected light) from the LED assembly 50 leave the composite optical lens 70 through the optical surface 76. The lens 70 is made of optical plastic, glass, or both usually clear to allow most of the light from the LED assembly 50 to pass through the lens 70.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used to practice the present invention. The invention is limited by the claims that follow.

What is claimed is:

1. A composite optical lens of a light emitting die package, the package including a leadframe and a molded body having a top portion and a bottom portion, the molded body integrated with portions of the leadframe so that the molded body top portion is above the leadframe and the molded body bottom portion is below the leadframe, a portion of the leadframe located within the molded body defining a mounting pad on which a light emitting device (LED) assembly is mounted, the molded body having a central opening through the top portion that receives the composite optical lens, the lens comprising:

a generally semi-spherical upper portion, a concave lower portion extending downward from the upper portion of the lens into the central opening towards the molded body bottom portion, the concave lower portion having a concave bottom surface adapted to receive light and to substantially surround the LED assembly, a concave cavity being formed between the concave bottom surface and a top surface of the leadframe within the central opening, the concave cavity at least partially filled with an encapsulant to encapsulate the LED assembly, wherein a lowest point of the concave lower portion of the lens within the central opening does not contact the top surface of the leadframe within the central opening to form a gap between the lowest point of the concave lower portion and the leadframe that is free of the encapsulant for permitting encapsulant expansion and contraction, a reflective surface on a lower portion of the lens that is adapted to reflect the received light, and an optical surface on the upper portion of the lens through which the reflected light leaves the lens.

2. The composite optical lens of claim 1, wherein the concave bottom surface is coated with an optical material to influence or change the light emitted by the LED assembly before it leaves the die package.

3. The composite optical of claim 2, wherein the optical material is selected from a group consisting of phosphor, diffusants, and frequency-shifting chemicals.

4. The composite optical lens of claim 1, wherein the reflective surface substantially surrounds the concave cavity.

5. The composite optical lens of claim 1, wherein the reflective surface is coated with a reflective material.

6. The composite optical lens of claim 5, wherein the reflective material is selected from a group consisting of gold, silver, and aluminum.

7. The composite optical lens of claim 1, wherein the reflective surface provides a total internal reflection (TIR) for at least a portion of the light emitted by the light emitting device.

8. The composite optical lens of claim 1, wherein the reflective surface has a given optical finish adapted to scatter the light.

9. The composite optical lens of claim 1, wherein the upper portion of the lens tapers at a ledge of the lens which rests on a horizontal surface of the molded body top portion so that the upper portion of the lens extends above the molded body top portion within the central opening.

10. A composite optical lens of a light emitting die package that has a central opening there through exposing a portion of a leadframe extending through the package, the leadframe portion within the package having an LED assembly mounted thereon, the lens comprising:

a generally semi-spherical upper portion extending upward through the central opening above an upper surface of the package, a concave lower portion extending downward from the upper portion of the lens into the central opening, the concave lower portion having a concave bottom surface adapted to receive light and to substantially surround the LED assembly, a concave cavity being formed between the concave bottom surface and a top surface of the leadframe portion within the central opening, wherein a lowest point of the concave lower portion of the lens within the central opening does not contact the top surface of the leadframe within the central opening to form a gap between the lowest point of the concave lower portion and the leadframe, a reflective surface on a lower portion of the lens to reflect received light, and an optical surface on the upper portion through which the reflected light leaves the lens.

11. A composite optical lens of a light emitting die package, comprising:

a generally semi-spherical upper portion, a concave lower portion having a concave bottom surface adapted to receive light and to substantially surround a LED assembly of the package, a concave cavity being formed in the lens and at least partially filled with an encapsulant to encapsulate the LED assembly, wherein a gap exists between a lowest point of the concave lower portion and a leadframe of the package that is free of the encapsulant, a reflective surface on a lower portion of the lens adapted to reflect received light, and an optical surface on the upper portion of the lens through which the reflected light leaves the lens.

\* \* \* \* \*